United States Patent
Marzen et al.

(10) Patent No.: US 7,452,258 B1
(45) Date of Patent: Nov. 18, 2008

(54) METHOD OF SEALING OLED COVER WITH LIQUID ADHESIVE

(75) Inventors: Vincent P. Marzen, Robins, IA (US); James D. Sampica, Springville, IA (US); Paul R. Nemeth, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 514 days.

(21) Appl. No.: 11/214,547

(22) Filed: Aug. 30, 2005

(51) Int. Cl.
H01J 1/62 (2006.01)
H01J 9/26 (2006.01)

(52) U.S. Cl. ........................................ 445/25; 313/512
(58) Field of Classification Search .................. 313/512; 445/24, 25
See application file for complete search history.

(56) References Cited

U.S. PATENT DOCUMENTS

| | | | |
|---|---|---|---|
| 5,592,288 A | 1/1997 | Sampica et al. | 356/62 |
| 6,784,612 B2 * | 8/2004 | Park et al. | 313/512 |
| 7,097,527 B2 * | 8/2006 | Matsuoka | 445/25 |
| 7,381,110 B1 * | 6/2008 | Sampica et al. | 445/25 |
| 2003/0017777 A1 * | 1/2003 | Matsuoka et al. | 445/24 |
| 2004/0225025 A1 * | 11/2004 | Sullivan et al. | 522/71 |

OTHER PUBLICATIONS

U.S. Appl. No. 11/214,518, "Process for Glass-to-Glass Sealing OLEDs With Dry Film Adhesive," James Sampica et al.
U.S. Appl. No. 11/215,050, "Process For Applying A Protective Cover On An Organic Light-Emitting Diode Using A Liquid Adhesive," James Sampica et al.
U.S. Appl. No. 11/215,683, "Panel-To-Panel Lamination Method For Improved Uniformity," Vincent Marzen et al.

* cited by examiner

Primary Examiner—Peter Macchiarolo
(74) Attorney, Agent, or Firm—Nathan O. Jensen

(57) ABSTRACT

A method of attaching a protective cover to an Organic Light-Emitting Diode (OLED) assembly is disclosed. According to the method, a liquid adhesive is applied to a substantial portion of a face one of the OLED assembly and the protective cover. The protective cover is substantially transparent. A face of the other of the OLED assembly and the protective cover is positioned upon the liquid adhesive. The liquid adhesive is cured to adhere the protective cover to the OLED assembly.

10 Claims, 4 Drawing Sheets

METHOD OF SEALING OLED COVER WITH LIQUID ADHESIVE

RELATED INVENTIONS

This application is related to the following co-pending U.S. patent applications, all of which are filed on an even date herewith and are incorporated by reference herein in their entirety:

U.S. patent application Ser. No. 11/214,518, "Process for Glass-to-Glass Sealing OLEDs With Dry Film Adhesive," James Sampica et al.;

U.S. patent application Ser. No. 11/215,050, "Process For Applying A Protective Cover On An Organic Light-Emitting Diode Using A Liquid Adhesive," James Sampica et al.; and U.S. patent application Ser. No. 11/215,683, "Panel-To-Panel Lamination Method For Improved Uniformity," Vincent Marzen et al.

FIELD OF THE INVENTION

The invention relates to displays, and more particularly, to the manufacture of organic light-emitting diode (OLED) displays.

BACKGROUND OF THE INVENTION

Organic light-emitting diodes (OLED) displays are light-emitting diodes that incorporate semiconducting organic polymers. OLEDs are beginning to be developed in large quantities and used in many different applications as OLED technology matures. However, because the organic materials used in OLED technology are sensitive to oxygen and humidity, these materials must be sealed to prevent penetration by air or water. One solution has been to adhere a capping or protective layer such as a sheet of glass upon the OLED materials by applying an adhesive around a perimeter of a face of the capping layer and the substrate upon which the OLED materials are disposed. The assembly may take place in an inert environment, or, the volume between the OLED materials and the capping layer may be backfilled with an inert gas such as argon or nitrogen after assembly. However, known processes do not provide an effective seal between the capping layer and the OLED materials. Known bonding processes often result in permeation through the bulk adhesive or the adhesive interface, which causes the OLED materials to be subject to destructive ambient conditions. What is needed is a reliable method of adhering a protective layer to an OLED assembly.

It is therefore an object of the invention to provide such a reliable method of adhering a protective layer to an OLED assembly.

A feature of the invention is adhering a protective layer onto an OLED assembly using a substantially transparent liquid adhesive.

An advantage of the invention is improved isolation of the OLED materials.

SUMMARY OF THE INVENTION

The invention provides a method of attaching a protective cover to an Organic Light-Emitting Diode (OLED) assembly. According to the method, a liquid adhesive is applied to a substantial portion of a face of either the OLED assembly or the protective cover. The protective cover is substantially transparent. A face of the other of the OLED assembly or the protective cover is positioned upon the liquid adhesive. The liquid adhesive is cured to adhere the capping layer to the OLED assembly.

The invention also provides a method of adhering a substantially transparent protective cover to an organic light-emitting diode (OLED) assembly. The OLED assembly includes a substrate. According to the method, The OLED assembly and the protective cover are adhered together using a first adhesive application that is applied to a perimeter region of a face of either the OLED assembly or the protective cover and then cured after the OLED assembly and the protective cover are assembled together. A liquid adhesive is then applied to substantially all of a volume defined by the OLED assembly, the protective cover, and the first adhesive application. The liquid adhesive is cured to adhere the protective cover to the OLED assembly.

The invention further provides an organic light-emitting diode (OLED) assembly. An OLED layer is provided. The OLED layer includes a substrate. A substantially transparent cover plate is positioned to protect the OLED layer. A liquid adhesive is applied to a substantial portion of one of a face of the OLED layer and a face of the cover plate. The liquid adhesive is cured when both the face of the OLED layer and the face of the cover plate contact the liquid adhesive, to thereby adhere the cover plate to the OLED layer.

DETAILED DESCRIPTION OF THE DRAWINGS

Figure 1:
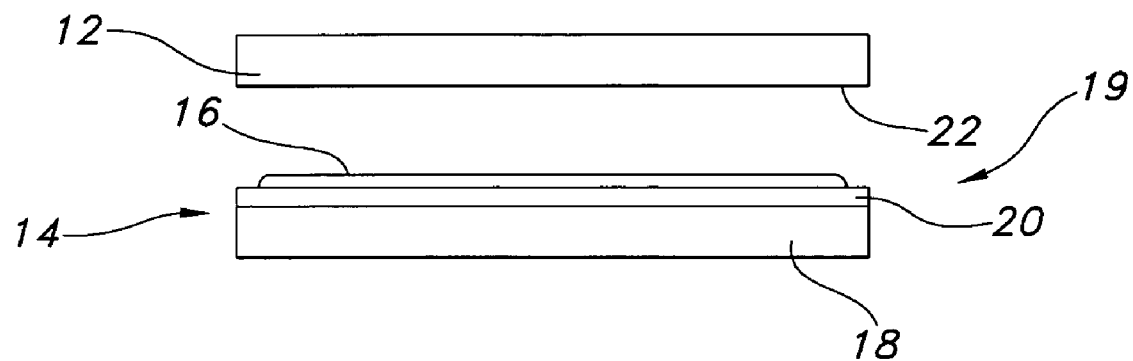
FIG. 1 is a side elevational view of an OLED assembly according to the invention.
Figure 2:
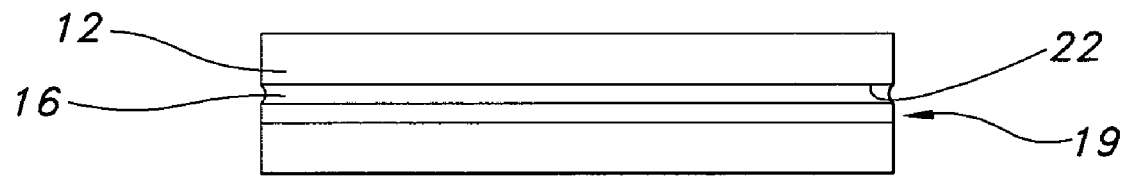
FIG. 2 is a side elevational view of an OLED assembly according to the invention.

Describing now the invention with reference to FIGS. 1-2, the invention provides a reliable method of applying a protective cover 12 to an OLED assembly 14. It should be noted that the drawings are not necessarily drawn to scale, and that the dimensions of the various disclosed components have been drawn for the purposes of clarity in understanding the invention. Protective cover 12, which may also be called a capping layer or a cover plate, is made of substantially transparent glass or plastic. OLED assembly 14 includes a back pane or substrate 18, which may be glass, stainless steel, plastic, or other suitable material. OLED materials 20 are disposed upon a face 19 of substrate 18 using any suitable manufacturing method. A transparent liquid adhesive 16 is dispensed upon face 19 of substrate, including OLED materials 20, such that substantially all of the face and the OLED materials are covered by the liquid adhesive. An exemplary type of liquid adhesive is XE-5844 manufactured by GE of Fairfield, Conn., although other liquid adhesives may be used.

Figure 3:
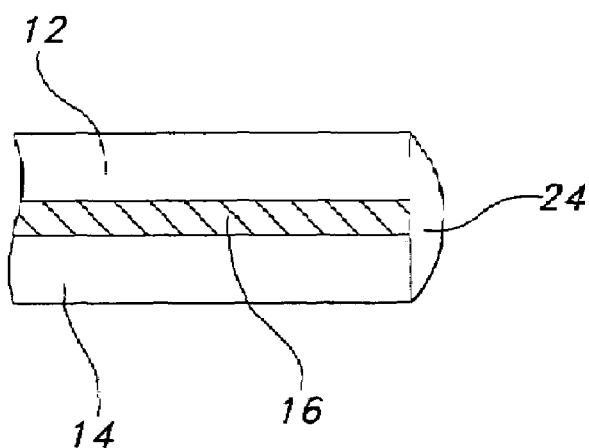
FIG. 3 is a partial side elevational view of the OLED assembly according to the invention.

Protective cover 12 is placed in contact with liquid adhesive 16 so that a face 22 of the protective cover is adjacent face 19 of OLED assembly 14, as shown in FIG. 2. The OLED assembly and the protective cover are permitted to stand for a period of time sufficient for the liquid adhesive to evenly distribute itself therebetween. The OLED assembly and the protective cover may then have an appropriate weight applied thereupon for an amount of time sufficient to induce and maintain a desired bondline. If necessary to speed up the curing process, the OLED assembly and the protective cover may be placed in an environment of increased temperature. If the combined OLED assembly is to be used in a severe environment, the edges of the combined OLED assembly and cover plate may be further sealed from moisture by applying an edge seal thereon, which in a preferred embodiment is an adhesive bead 24 applied to the combined edges of OLED assembly 14 and protective cover 12, as shown in FIG. 3.

Figure 4:
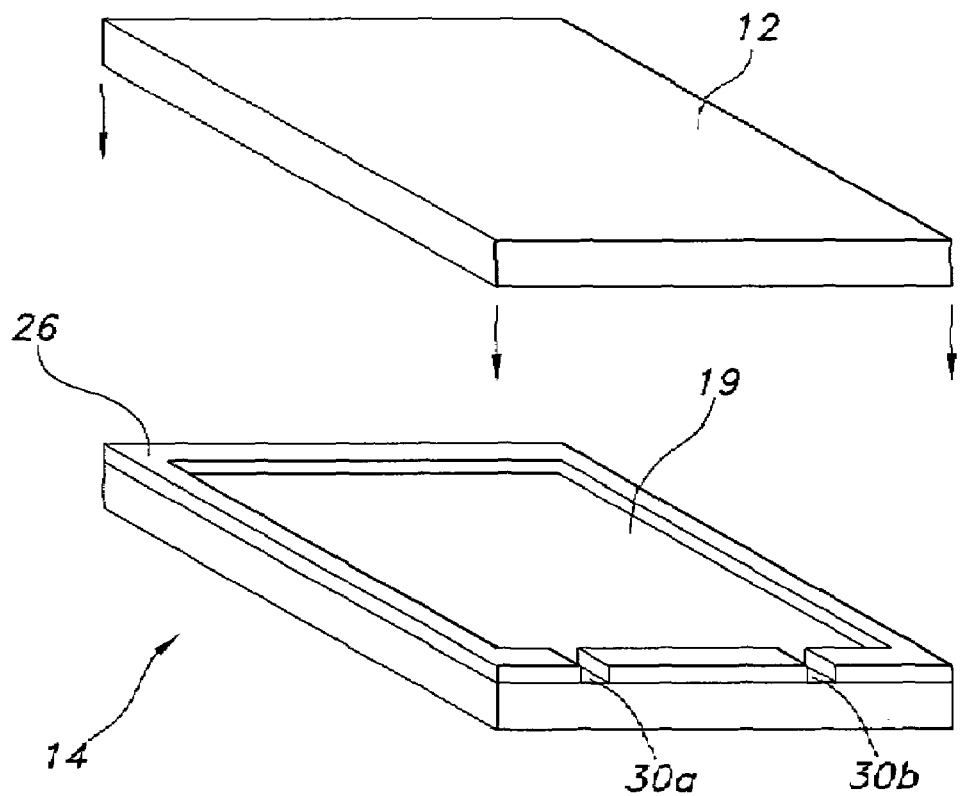
FIG. 4 is a perspective view of an OLED assembly according to another embodiment of the invention.
Figure 5:
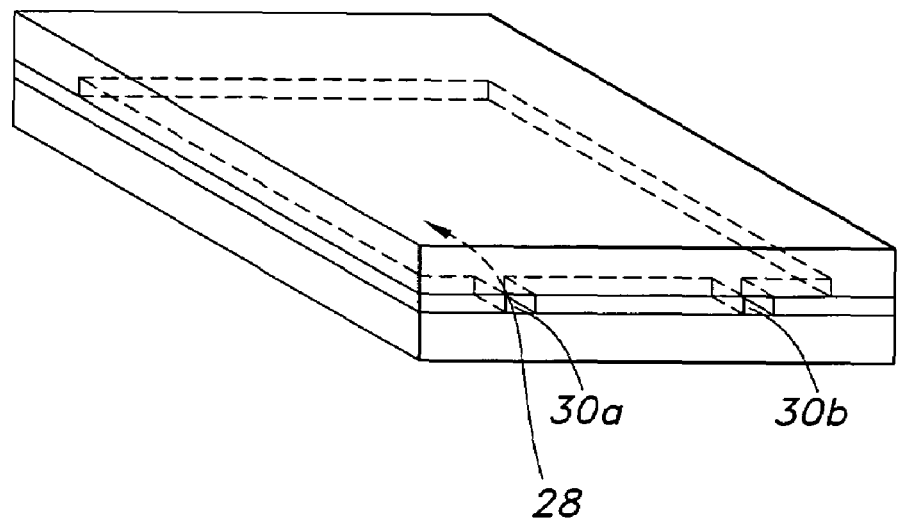
FIG. 5 is a top side elevational view of an OLED assembly according to the embodiment shown in FIG. 4.

FIG. 4 shows another embodiment of the invention in which a protective cover 12 is adhered to OLED assembly 14 using liquid adhesive in combination with a perimeter seal. As shown in FIG. 4, a first, or boundary, adhesive 26 is applied to a perimeter of face 19 of OLED assembly 14. Boundary adhesive 26 is preferably a semi-solid adhesive that is precut to form a substantially continuous border or frame around face 19. Suitable materials for the boundary adhesive include VHB, manufactured by 3M of Minneapolis, Minn., or a pressure-sensitive or dual-stage adhesive applied to both sides of a plastic frame precut to suitable dimensions. The boundary adhesive is applied to have a constant thickness, which is usually between 0.010 and 0.040 inches thick. Protective cover 12 is placed in contact with boundary adhesive 26 and is adhered thereto (FIG. 5). Boundary adhesive 26 is then cured. The protective cover, the OLED assembly and the boundary adhesive define a substantially enclosed cavity or volume 28 accessible by a plurality of ports 30a, 30b that are cut or otherwise created in the boundary adhesive.

Figure 6:
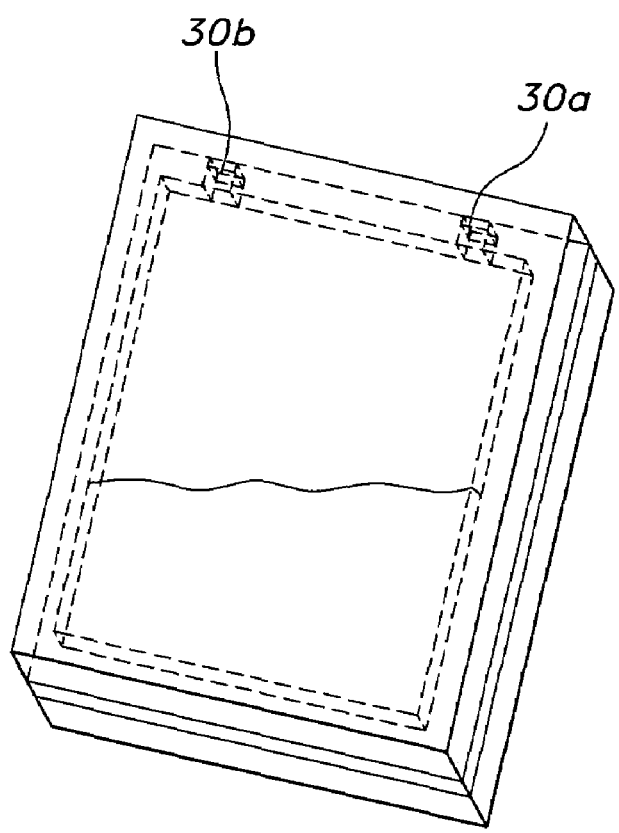
FIG. 6 is a perspective view of the OLED assembly according to the embodiment shown in FIG. 4.
Figure 7:
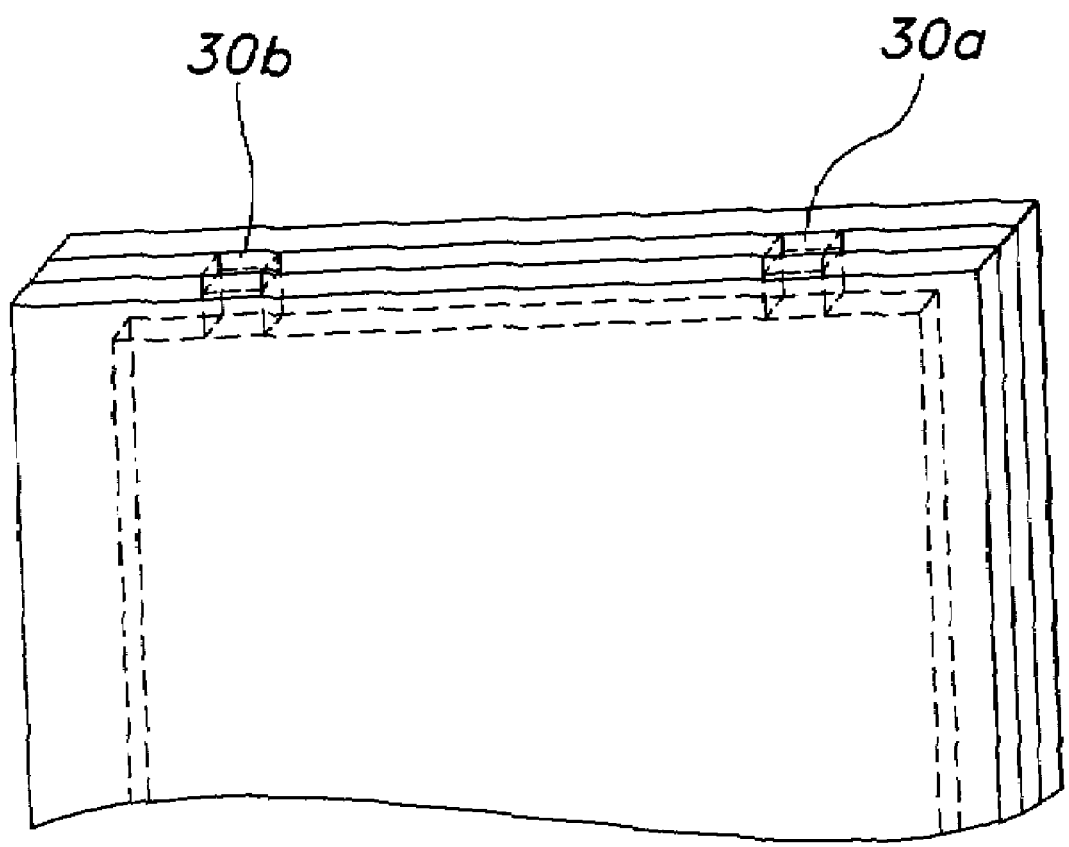
FIG. 7 is another perspective view of the OLED assembly of FIG. 4.

A liquid adhesive 32 is inserted through one of the ports 30a, 30b. As shown in FIG. 6, the combined OLED assembly and protective cover are oriented such that the liquid adhesive 32 is poured or otherwise inserted into the substantially enclosed volume 28 through a first port 30a while a second port 30b functions as an escape vent for gases such as air and excess liquid adhesive as volume 28 is filled with liquid adhesive 32. Once the volume is completely filled, first and second ports 30a, 30b are filled in with liquid adhesive 32, as shown in FIG. 7, and the liquid adhesive is cured as previously discussed. Post-cure capping plugs (not shown) may be applied to ports 30a, 30b for enhanced protection. The capping plugs may comprise an additional application of a suitable adhesive, foil tape, mechanical plugs, or the like.

The invention may be varied in many ways while maintaining the spirit of the invention. For example, substrate 18 may be made of a flexible material. If so, extra measures may be required to immobilize OLED assembly 14 during the manufacturing process. Furthermore, alternate curing methods are permissible depending on the adhesive type chosen. Finally, the liquid adhesive may be applied to a face of the protective cover instead of the OLED assembly or substrate.

An advantage of the invention is that the liquid adhesive, in combination with the protective cover, provides especially effective protection to the OLED materials against air and humidity. Because the liquid adhesive completely covers the OLED materials instead of just the border between the protective cover and the OLED assembly, permeation through the adhesive will take a significant amount of time, thereby reducing the likelihood of damage to the OLED materials. However, since the thickness of the adhesive between the OLED assembly and the protective cover directly impacts the pixel erosion rate of the OLED materials, the adhesive thickness should be minimized while maintaining an effective, producible OLED assembly.

Another advantage is that the liquid adhesive can be de-aired, and is therefore less prone to manufacturing defects such as bubbles. Using the principles disclosed herein, such manufacturing defects can be adequately controlled.

Still another advantage of the invention is that both embodiments of the disclosed invention, i.e. the face seal and the combined face/perimeter seal, may be implemented without substantial changes to other manufacturing processes used to make the OLED.

Yet another advantage is the elimination of the vacuum or oxygen-free cavity that is required to be maintained by a border-only adhesive seal between the protective cover and the OLED assembly.

While the invention has been disclosed in its preferred form, the specific embodiments thereof as disclosed and illustrated herein are not to be considered in a limiting sense as numerous variations are possible. The subject matter of the invention includes all novel and non-obvious combinations and subcombinations of the various elements, features, functions, and/or properties disclosed herein. No single feature, function, element or property of the disclosed embodiments is essential to all of the disclosed inventions. Similarly, where the claims recite "a" or "a first" element or the equivalent thereof, such claims should be understood to include incorporation of one or more such elements, neither requiring nor excluding two or more such elements.

It is believed that the following claims particularly point out certain combinations and subcombinations that are directed to the disclosed inventions and are novel and non-obvious. Inventions embodied in other combinations and subcombinations of features, functions, elements and/or properties may be claimed through amendment of the present claims or presentation of new claims in this or a related application. Such amended or new claims, whether they are directed to a different invention or directed to the same invention, whether different, broader, narrower or equal in scope to the original claims, are also regarded as included within the subject matter of the invention of the present disclosure.

What is claimed is:

1. A method of adhering a substantially transparent protective cover to an organic light-emitting diode (OLED) assembly, the OLED assembly including a substrate, the method comprising:

adhering the OLED assembly and the protective cover together using a first adhesive application, the first adhesive application being applied to a perimeter region of a face of one of the OLED assembly and the protective cover;

applying a liquid adhesive, through a first opening in the liquid adhesive application, to substantially all of a volume defined by the OLED assembly, the protective cover, and the first adhesive application;

providing a second opening in the first adhesive application to permit the evacuation of gases in the volume while liquid adhesive is applied through the first opening into the volume;

while applying the liquid adhesive, positioning the OLED assembly and the protective cover such that gases displayed by the application of liquid adhesive through the first opening freely exit the volume through the second opening; and curing the liquid adhesive to adhere the protective cover to the OLED assembly.

2. The method of claim 1, further comprising:

filling the first and second openings with liquid adhesive when the volume is filled with liquid adhesive.

3. The method of claim 1, wherein curing the liquid adhesive includes placing the OLED assembly and the protective cover in an environment of increased temperature.

4. The method of claim 1, wherein the first adhesive application is a semi-solid adhesive.

5. The method of claim 1, wherein the first adhesive application includes a pressure-sensitive adhesive material.

6. The method of claim 1, wherein the liquid adhesive is poured into the volume.

7. The method of claim 1, wherein the first adhesive application is cured prior to applying the liquid adhesive.

8. An organic light-emitting diode (OLED) assembly, comprising:
- an OLED layer, including a substrate;
- a substantially transparent cover plate positioned to protect the OLED layer;
- a liquid adhesive applied to a substantial portion of one of a face of the OLED layer and a face of the cover plate, the liquid adhesive being cured when both the face of the OLED layer and the face of the cover plate contact the liquid adhesive, to thereby adhere the cover plate to the OLED layer;
- a second adhesive applied to adhere a perimeter of the face of the OLED layer to a perimeter of the face of the cover plate;
- wherein the liquid adhesive is applied to a volume defined by the face of the OLED layer, the face of the cover plate, and the second adhesive after the OLED layer and the cover plate have been at least partially adhered together by the second adhesive;
- a first opening in the second adhesive through which the liquid adhesive enters the volume; and
- a second opening in the second adhesive through which gases exit the volume when the liquid adhesive enters the volume.

9. The OLED assembly of claim 8, wherein the second adhesive is a semi-solid adhesive.

10. The OLED assembly of claim 8, wherein the second adhesive includes a pressure-sensitive adhesive material.

* * * * *